(12) United States Patent
Yoshida et al.

(10) Patent No.: US 11,329,601 B2
(45) Date of Patent: May 10, 2022

(54) ENERGY HARVESTING APPARATUS

(71) Applicant: ZEON CORPORATION, Tokyo (JP)

(72) Inventors: Masayoshi Yoshida, Tokyo (JP); Kiyoshige Kojima, Tokyo (JP); Midori Yamaai, Tokyo (JP); Naomi Shiga, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 219 days.

(21) Appl. No.: 16/643,587

(22) PCT Filed: Aug. 7, 2018

(86) PCT No.: PCT/JP2018/029667
§ 371 (c)(1),
(2) Date: Mar. 2, 2020

(87) PCT Pub. No.: WO2019/058799
PCT Pub. Date: Mar. 28, 2019

(65) Prior Publication Data
US 2020/0321912 A1 Oct. 8, 2020

(30) Foreign Application Priority Data
Sep. 22, 2017 (JP) .............................. JP2017-182556

(51) Int. Cl.
H02S 40/34 (2014.01)
H01L 31/0224 (2006.01)
H05K 1/18 (2006.01)

(52) U.S. Cl.
CPC ...... *H02S 40/34* (2014.12); *H01L 31/022441* (2013.01); *H05K 1/189* (2013.01); *H05K 2201/0108* (2013.01)

(58) Field of Classification Search
CPC .......... H02S 20/20; H02S 20/22; H02S 20/26; H01L 30/20
See application file for complete search history.

(56) References Cited

U.S. PATENT DOCUMENTS

| 2007/0084501 A1 | 4/2007 | Kalberlah et al. |
| 2008/0156365 A1 | 7/2008 | Scholz et al. |

(Continued)

FOREIGN PATENT DOCUMENTS

| CN | 201860133 U | 6/2011 |
| EP | 3306814 A1 | 4/2018 |

(Continued)

OTHER PUBLICATIONS

Mar. 24, 2020, International Preliminary Report on Patentability issued in the International Patent Application No. PCT/JP2018/029667.

(Continued)

*Primary Examiner* — Daniel P Malley, Jr.
(74) *Attorney, Agent, or Firm* — Kenja IP Law PC

(57) ABSTRACT

Disclosed is an energy harvesting apparatus which comprises: a flexible energy harvesting module having a flat plate shape; a connector which is mechanically and electrically connectable to an external connector; a rigid member having a flat plate shape; and an electric wiring constituting a part of a front surface of the rigid member, wherein an edge of a back surface of the energy harvesting module is disposed on the front surface of the rigid member, and the connector is disposed on the front surface of the rigid member at a position spaced apart from the energy harvesting module and is electrically connected to the energy harvesting module via the electric wiring.

14 Claims, 9 Drawing Sheets

(56) References Cited

U.S. PATENT DOCUMENTS

| | | | | |
|---|---|---|---|---|
| 2008/0271774 A1* | 11/2008 | Kalkanoglu | ............ | H02S 20/23 |
| | | | | 136/244 |
| 2009/0242015 A1* | 10/2009 | Wattman | ................ | H02S 20/25 |
| | | | | 136/251 |
| 2014/0000709 A1* | 1/2014 | Langmaid | ............... | H02S 20/25 |
| | | | | 136/259 |
| 2014/0174004 A1* | 6/2014 | Livsey | ................... | F24S 25/61 |
| | | | | 52/173.3 |
| 2018/0097469 A1 | 4/2018 | Yoshida et al. | | |
| 2018/0131318 A1 | 5/2018 | Yamaai et al. | | |

FOREIGN PATENT DOCUMENTS

| | | | |
|---|---|---|---|
| JP | 2001339088 | A | 12/2001 |
| JP | 2007019499 | A | 1/2007 |
| JP | 2011044242 | A | 3/2011 |
| WO | 2016152086 | A1 | 9/2016 |
| WO | 2016189861 | A1 | 12/2016 |

OTHER PUBLICATIONS

Sep. 11, 2018, International Search Report issued in the International Patent Application No. PCT/JP2018/029667.
May 17, 2021, the Extended European Search Report issued by the European Patent Office in the corresponding European Patent Application No. 18857794.4.

\* cited by examiner

ENERGY HARVESTING APPARATUS

TECHNICAL FIELD

The present disclosure relates to an energy harvesting apparatus, and more particularly, to a portable energy harvesting apparatus.

BACKGROUND

In recent years, there has been an increasing demand for portable energy harvesting apparatuses that generate electric power in accordance with the external environment so that users can use portable electronic devices such as smartphones, notebook personal computers (PCs), tablet PCs, and the like even in outdoor areas where they cannot obtain commercial power supply. Examples of such an energy harvesting apparatus include an apparatus including a solar cell that generates power using light energy such as solar light, and an apparatus including a thermoelectric conversion element that generates power using heat energy such as geothermal heat.

Such an energy harvesting apparatus includes an energy harvesting module such as a solar cell, and a connector for outputting electric power generated by the energy harvesting module to the outside (see, e.g., PTLS 1 to 3). The energy harvesting module is in the form of a thin flat plate. The connector can be detachably attached to another connector (external connector) provided in a connecting cable or the like for connect to another apparatus.

CITATION LIST

Patent Literature

PTL 1: WO2016/152086
PTL 2: JP2011-44242 A
PTL 3: JP2007-19499 A

SUMMARY

Technical Problem

The energy harvesting apparatus described in PTL 1 is configured such that a connector is directly connected to an energy harvesting module. Therefore, a stress generated when the connector is attached to or detached from the external connector is easily transmitted to the energy harvesting module. Because the energy harvesting module is in the form of a thin flat plate, it may not be preferable to impose a burden due to stress. The energy harvesting apparatuses described in PTL 2 and PTL 3 include rigid members disposed so as to sandwich the opposing sides of the energy harvesting module. This enhances the rigidity of the energy harvesting module but increases the thickness of the entire energy harvesting apparatus and hence the size of the apparatus, which may impair the portability of the energy harvesting apparatus.

It is therefore an object of the present disclosure to solve the problem set forth above and provide an energy harvesting apparatus wherein a stress applied to the energy harvesting module when a connector is attached to or detached from an external connector can be mitigated while ensuring the portability of the apparatus.

Solution to Problem

The present disclosure aims at advantageously solving the problems described above. The disclosed energy harvesting apparatus comprises: a flexible energy harvesting module having a flat plate shape; a connector which is mechanically and electrically connectable to an external connector; a rigid member having a flat plate shape; and an electric wiring constituting a part of a front surface of the rigid member, wherein an edge of a back surface of the energy harvesting module is disposed on the front surface of the rigid member, and wherein the connector is disposed on the front surface of the rigid member at a position spaced apart from the energy harvesting module and is electrically connected to the energy harvesting module via the electric wiring. With such a configuration, the energy harvesting module and the connector are disposed on the front surface of the rigid member without overlapping each other, whereby the thickness of the entire energy harvesting apparatus can be reduced and portability can be ensured. In addition, since the energy harvesting module is disposed at a position spaced apart from the connector via the rigid member, a stress applied to the energy harvesting module when the connector is attached to or detached from an external connector can be mitigated.

In the disclosed energy harvesting apparatus, it is preferable that the connector includes a first connector and a second connector. It is preferable that in a plan view of the energy harvesting module, the first connector and the second connector are disposed at positions spaced apart from each other along a second direction which is perpendicular to the first direction in the direction in which the energy harvesting module is positioned with respect to the rigid member, and are connectable to the external connector along the second direction. With such a configuration, the energy harvesting apparatus allows for bidirectional connection of an external connector.

In the disclosed energy harvesting apparatus, it is preferable that the energy harvesting module overlaps 40% or more of the rigid member along the second direction. With such a configuration, the energy harvesting module can be fixed firmly to the rigid member and the rigidity of the energy harvesting module can also be increased.

In the disclosed energy harvesting apparatus, it is preferable that at least one of the first connector and the second connector is positioned inwardly of the energy harvesting module in the second direction.

It is preferable that the disclosed energy harvesting apparatus further includes a connecting cable including the external connector which is detachably attachable to at least one of the first connector and the second connector. It is preferable that the external connector is located at a position other than the outside of the energy harvesting module in the second direction in a state where the external connector is connected to the first connector or second connector. With such a configuration, even when an external connector is connected to the connector, the external connector does not protrude in the second direction beyond the energy harvesting module, so that handleability can be improved.

In the disclosed energy harvesting apparatus, it is preferable that the energy harvesting module has a first extraction electrode and a second extraction electrode which are positioned at the edge of the back surface of the energy harvesting module. It is preferable that the first connector is electrically connectable to the first extraction electrode and the second extraction electrode through the electric wiring. It is preferable that the second connector is electrically connectable to the first extraction electrode and the second extraction electrode through the electric wiring.

In the disclosed energy harvesting apparatus, it is preferable that the rigid member is a rigid substrate having the electric wiring integrally formed on the front surface. With such a configuration, the manufacturing process of disposing an electric wiring on a rigid member can be simplified.

In the disclosed energy harvesting apparatus, it is preferable that the electric wiring is a flexible wiring board and forms a part of the front surface by covering a part of the rigid member. With such a configuration, the electric wiring can be shaped thinner, and the manufacturing process can be simplified.

In the disclosed energy harvesting apparatus, it is preferable that at least a part of the flexible wiring board is transparent. It is preferable that at least a part of the rigid member is transparent. It is preferable that the flexible wiring board and the rigid member are bonded to each other with a transparent bonding material interposed therebetween. With such a configuration, it is possible to improve the visibility of an object located at a distance and overlapping the energy harvesting apparatus.

In the disclosed energy harvesting apparatus, it is preferable that the rigid member is a rigid frame. It is preferable that the electric wiring is a flexible wiring board and disposed at a position where the periphery is covered by the rigid member. With such a configuration, it is possible to reduce the weight while maintaining the strength of the energy harvesting apparatus.

It is preferable that the disclosed energy harvesting apparatus further includes an additional connector which is mechanically and electrically connectable an external connector, an additional rigid member having a flat plate shape, an additional electric wiring constituting a part of a front surface of the additional rigid member, and a conductive member for electrically connecting the connector and the additional connector. In the energy harvesting module, it is preferable that a part on one side of the edge of the back surface of the energy harvesting module is disposed on the front surface of the rigid member, and a part on the other side of the edge of the back surface of the energy harvesting module is disposed on the front surface of the additional rigid member. It is preferable that the additional connector is disposed on the front surface of the additional rigid member at a position spaced apart from the energy harvesting module and is electrically connected to the energy harvesting module via the additional electric wiring. With such a configuration, since the rigid member and the additional rigid member are disposed at positions corresponding to the connector and the additional connector, respectively, the total amount of the rigid member used can be reduced, so that size reduction and weight reduction can be achieved.

It is preferable that the disclosed energy harvesting apparatus further includes a mechanical connector which is mechanically connectable to an external connector, the mechanical connector being provided at an edge, opposite to the foregoing edge, of the back surface of the energy harvesting module. With such a configuration, in addition to connection by the connector, the apparatus can be connected to another apparatus also by the mechanical connector, so that the connection state with other apparatus can be further stabilized.

In the disclosed energy harvesting apparatus, it is preferable that the connector has a thickness which is larger than a thickness of the energy harvesting module. With such a configuration, even if an impact is applied from the front surface side of the energy harvesting apparatus, the connector absorbs more impact from the front surface side to further reduce the impact on the energy harvesting module.

In the disclosed energy harvesting apparatus, it is preferable that the connector is a female connector. With such a configuration, the energy harvesting apparatus can be reduced in size.

It is preferable that the disclosed energy harvesting apparatus further includes a cover member which covers at least a part of the connector on the front surface side of the rigid member. With such a configuration, the environmental resistance of the connector and the like of the energy harvesting apparatus can be enhanced.

Advantageous Effect

According to the present disclosure, it is possible to provide an energy harvesting apparatus wherein a stress applied to the energy harvesting module when a connector is attached to or detached from an external connector can be mitigated while ensuring the portability of the apparatus.

DETAILED DESCRIPTION

Figure 1:
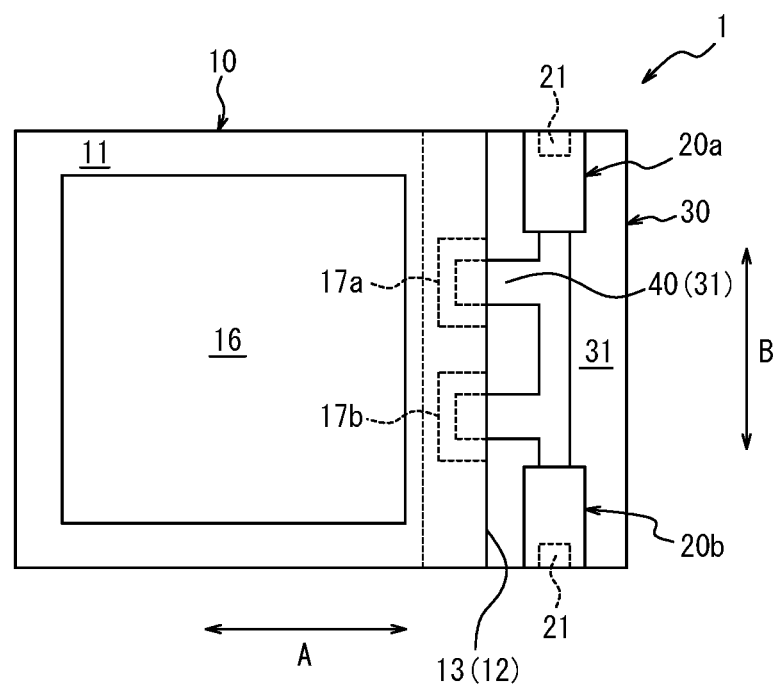
FIG. 1 is a plan view of an energy harvesting apparatus according to an embodiment of the present disclosure.

Hereinafter, embodiments of the present disclosure will be described with reference to the accompanying drawings. In the drawings, common components are denoted by the same reference numerals. The present disclosure is not limited to the embodiments described below.

[Configuration of Energy Harvesting Apparatus]

Figure 2:
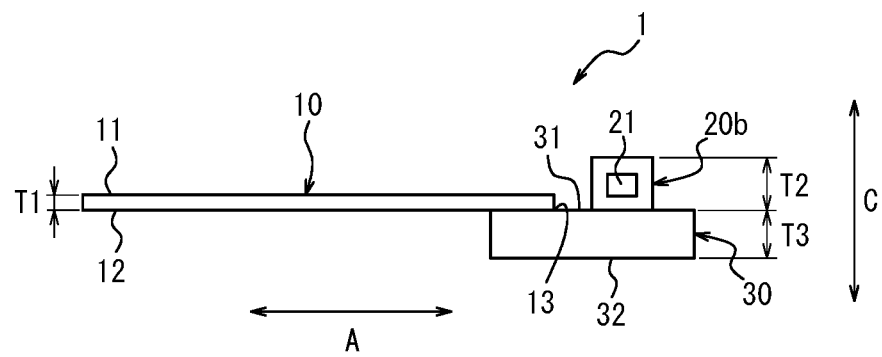
FIG. 2 is a front view of the energy harvesting apparatus shown in FIG. 1.

FIG. 1 is a plan view of an energy harvesting apparatus 1 according to an embodiment of the present disclosure. FIG. 2 is a front view of the energy harvesting apparatus 1. As shown in FIGS. 1 and 2, the energy harvesting apparatus 1 includes an energy harvesting module 10, a connector 20, a rigid member 30, and an electric wiring 40. The connector 20 of the present embodiment includes a first connector 20*a* and a second connector 20*b*.

The energy harvesting module 10 generates electric power according to the external environment. In other words, the electric power generated by the energy harvesting module 10 varies depending on the external environment.

The energy harvesting module 10 includes, for example, a solar cell that generates power using light energy such as solar light or room light. The energy harvesting module 10 includes, for example, a thermoelectric conversion element that generates power using thermal energy such as geothermal heat.

The energy harvesting module 10 of the present embodiment includes a solar cell panel 16 composed of solar cells. The solar cell panel 16 is a member composed of solar cells that photoelectrically convert incident light such as sunlight and/or room light to output electric power. Types of solar cells constituting solar panel 16 are roughly classified into inorganic solar cells in which an inorganic material is used and organic solar cells in which an organic material is used. Examples of inorganic solar cells include silicon (Si) solar cells in which silicon is used and compound solar cells in which a compound is used. Examples of organic solar cells include thin-film solar cells such as low-molecular weight vapor deposition-type solar cells in which an organic pigment is used, polymer coating-type solar cells in which a conductive polymer is used, and coating-conversion-type solar cells in which a conversion-type semiconductor is used; and dye-sensitized solar cells formed from titania, an organic dye, and an electrolyte. The solar cells constituting the solar panel 16 can also include organic/inorganic hybrid solar cells and solar cells in which a perovskite compound is used. In the present embodiment, because the solar cell panel 16 has a thin panel-like shape, a dye-sensitized solar cell manufactured on a plastic film or the like is preferred in that it can be easily shaped to have a thin shape. It is needless to say that the solar cell panel 16 is not limited to the one made on the above-mentioned plastic film or the like and may be of any type as long as it is thin.

As shown in FIGS. 1 and 2, the energy harvesting module 10 is a flexible flat plate member. The energy harvesting module 10 of the present embodiment is rectangular in the plan view of FIG. 1. In the energy harvesting module 10, the solar cell panel 16 is disposed so that incident light from a front surface 11 is incident on the solar cell panel 16. The energy harvesting module 10 includes an extraction electrode 17 located at an edge 13 of a back surface 12. The extraction electrode 17 of the present embodiment includes a first extraction electrode 17a and a second extraction electrode 17b. The first extraction electrode 17a and the second extraction electrode 17b are disposed at positions spaced apart from each other along the edge 13. The energy harvesting module 10 outputs the generated electric power from the first extraction electrode 17a and the second extraction electrode 17b.

The first extraction electrode 17a and the second extraction electrode 17b are not particularly limited, and have a conductor formed of common conductive materials. Examples of such conductors include conductors formed of a metal material selected from the group consisting of copper, aluminum, nickel, and iron; conductors made of an alloy material containing these metal materials; and conductive adhesives. In particular, the conductor of the first extraction electrode 17a and the second extraction electrode 17b is a metal foil, and electrodes using foil copper as a conductor are particularly preferable. "Metal foil" as used herein refers to a metal having a foil shape with a thickness of 300 μm or less.

Each of the first connector 20a and the second connector 20b has a connecting part 21. The first connector 20a and the second connector 20b are mechanically and electrically connectable to an external connector 61 (see FIG. 4) through the respective connecting parts 21. The external connector 61 is a connector provided on a connecting cable 60 (see FIG. 4) or other member external of the energy harvesting apparatus 1. In the first connector 20a and the second connector 20b of the present embodiment, the external connector 61 can be detachably attached to each connecting part 21.

The first connector 20a and the second connector 20b may be female or male connectors. In other words, the connecting parts 21 of the first connector 20a and the second connector 20b may be female or male. One of the first connector 20a and the second connector 20b may be a female connector and the other may be a male connector. From the viewpoint of downsizing the entire energy harvesting apparatus 1, as shown in FIG. 1, it is preferable that both the first connector 20a and the second connector 20b are female connectors.

The rigid member 30 is a flat plate member. The rigid member 30 of the present embodiment has a rectangular shape in the plan view of FIG. 1. The electric wiring 40 constitutes a part of a front surface 31 of the rigid member 30. The rigid member 30 may be a rigid substrate in which the electric wiring 40 is integrally formed on the front surface 31. By using as the rigid member 30 a rigid substrate in which the electric wiring 40 is formed, the manufacturing process of disposing the electric wiring 40 in the rigid member 30 can be simplified. Further, the electric wiring 40 may be a printed board that constitutes a part of the front surface 31 by covering a part of the rigid member 30. When the electric wiring 40 is a printed board, it is preferable to use a flexible wiring board from the viewpoint of thinness and ease of manufacturing process.

The rigid member 30 is formed of resin, metal or other various materials having rigidity. As will be described later, when at least a part of the rigid member 30 is made transparent, for example, transparent resins, glass or the like can be used as the material, with transparent resins being preferable from the viewpoint of weight reduction. Examples of transparent resins usable herein include acrylic resins, cycloolefin polymer (COP) resins, polycarbonate, styrene resins, polyesters, cellulose resins, and polyolefins.

The positional relationship of the members included in the energy harvesting apparatus 1 will now be described. As shown in FIGS. 1 and 2, in the energy harvesting module 10, the edge 13 of the back surface 12 is disposed on the front surface 31 of the rigid member 30. In other words, the energy harvesting module 10 and the rigid member 30 are partially overlapped each other such that the back surface 12 of the energy harvesting module 10 and the front surface 31 of the rigid member 30 face each other. The first extraction electrode 17a and the second extraction electrode 17b of the energy harvesting module 10 are each in contact with the electrical wiring 40 constituting a part of the front surface 31 of the rigid member 30 and are electrically connected to the electrical wiring 40. Details of the circuit configuration of the energy harvesting apparatus 1 will be described later.

As shown in FIG. 1, each of the first connector 20a and the second connector 20b is disposed at a position apart from the energy harvesting module 10 on the front surface 31 of the rigid member 30. The first connector 20a and the second connector 20b are each in contact with the electrical wiring 40 and are electrically connected to the electrical wiring 40. In this manner, the first connector 20a and the second connector 20b are each electrically connected to the energy harvesting module 10 via the electrical wiring 40. As described above, since the energy harvesting module 10 is disposed at a position spaced apart from the first connector 20a and the second connector 20b via the rigid member 30, the stress applied to the energy harvesting module 10 at the time when the first connector 20a or the second connector 20b is attached to or detached from the external connector 61 (see FIG. 4) can be mitigated.

The energy harvesting module 10 and the rigid member 30 are bonded to each other with a bonding material such as an adhesive or tackifier. As will be described later, when a part of the energy harvesting apparatus 1 is made transparent, the use of a transparent bonding material such as a transparent adhesive as a bonding material provides transparency to the joint between the energy harvesting module 10 and the rigid member 30. Each of the first connector 20a and the second connector 20b is bonded to the electrical wiring 40 by soldering or other means.

The first connector 20a and the second connector 20b are disposed at positions spaced apart from each other along a second direction B in the plan view of the energy harvesting module 10 shown in FIG. 1. The second direction B is a direction perpendicular to a first direction A in the plan view of FIG. 1. The first direction A is a direction along the direction in which the energy harvesting module 10 is positioned with respect to the rigid member 30 in the plan view of FIG. 1. Each of the first connector 20a and the second connector 20b is connectable to the external connector 61 along the second direction B. In the present embodiment, the ends in the second direction B of the connecting parts 21 of the first connector 20a and the second connector 20b are located at the same positions as the ends of the rigid member 30 in the plan view shown in FIG. 1.

As shown in FIG. 2, the energy harvesting module 10, the first connector 20a and the second connector 20b are disposed on the surface 31 of the rigid member 30 such that the energy harvesting module 10 does not overlap the first connector 20a and the second connector 20b. It is thus possible to reduce the thickness of the entire energy harvesting apparatus 1. More specifically, the thickness T1 of the energy harvesting module 10 is smaller than the thickness T2 of the first connector 20a and the second connector 20b. Hence, the thickness of the entire energy harvesting apparatus 1 equals to T2+T3, which is the sum of the thickness T2 of the first connector 20a and the second connector 20b plus the thickness T3 of the rigid member 30.

In addition, since the energy harvesting module 10, the first connector 20a, and the second connector 20b are disposed on the same side on the front surface 31 of the rigid member 30, for example, when an impact is applied from the outside, a part of the impact from the front surface 31 side is absorbed by the first connector 20a and the second connector 20b, and a part of the impact from the back surface 32 side is absorbed by the rigid member 30. Therefore, the impact on the energy harvesting module 10 can be reduced. In particular, since the thickness T2 of the first connector 20a and the second connector 20b is larger than the thickness T1 of the energy harvesting module 10, the first connector 20a and the second connector 20b absorb more impact from the front surface 31 side, whereby the impact on the energy harvesting module 10 can be further reduced.

The thickness T1 of the energy harvesting module 10 is suitably 3 mm or less from the viewpoint of manufacturing technology, for example. The lower limit of the thickness T1 of the energy harvesting module 10 is suitably about 10 μm.

Figure 3:
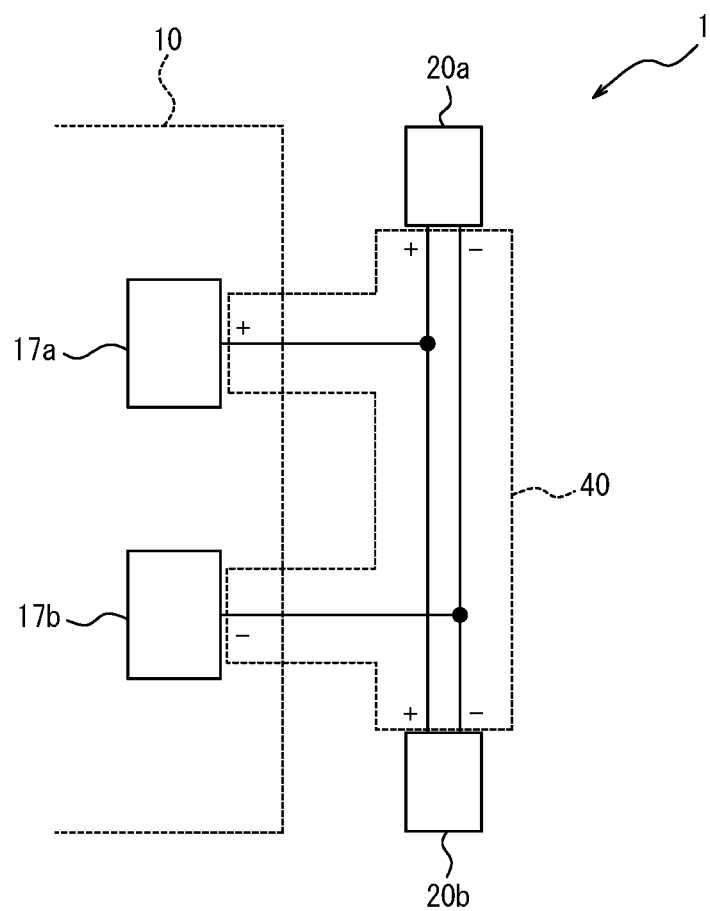
FIG. 3 is a schematic diagram showing a circuit configuration of the energy harvesting apparatus shown in FIG. 1.

FIG. 3 is a schematic diagram showing a circuit configuration of the energy harvesting apparatus 1. As shown in FIG. 3, the first extraction electrode 17a is a positive electrode of the energy harvesting module 10. The second extraction electrode 17b is a negative electrode of the energy harvesting module 10. The electric wiring 40 electrically connects the first extraction electrode 17a to the positive electrode of each of the first connector 20a and the second connector 20b. The electric wiring 40 electrically connects the second extraction electrode 17b to the negative electrode of each of the first connector 20a and the second connector 20b. In other words, the first connector 20a is electrically connectable to the first extraction electrode 17a and the second extraction electrode 17b via the electric wiring 40. The second connector 20b is electrically connectable to the first extraction electrode 17a and the second extraction electrode 17b via the electric wiring 40.

[Configuration of Connecting Cable 60]

Figure 4:
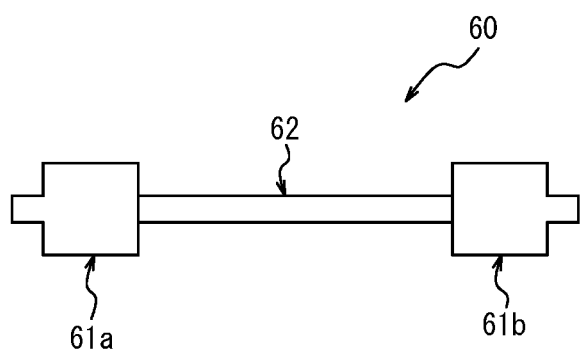
FIG. 4 shows a connecting cable with an external connector connectable to the connector shown in FIG. 1.

FIG. 4 shows a connecting cable 60 having an external connector 61 connectable to the first connector 20a and the second connector 20b. The connecting cable 60 includes a cable-shaped conductive member 62, and a first external connector 61a and a second external connector 61b as two external connectors 61 located at opposite ends of the conductive member 62. The connecting cable 60 can electrically connect the energy harvesting apparatus 1 to another apparatus by connecting one of the first external connector 61a and the second external connector 61b (here, the first external connector 61a) to the first connector 20a or the second connector 20b and connecting the other (here, the second external connector 61b) to the connector of the apparatus. In this case, the first external connector 61a is a connector of a type corresponding to the first connector 20a or the second connector 20b of the connection target. In other words, the first external connector 61a to be connected to the first connector 20a or the second connector 20b is a male connector if the connection target is a female connector and is a female connector if the connection target is a male connector. Similarly, the second external connector 61b is a connector of a type corresponding to the connector of another apparatus to be connected. The first external connector 61a and the second external connector 61b may be connectors of the same or different type. When the first external connector 61a and the second external connector 61b are connectors of the same type, the energy harvesting apparatus 1 and another apparatus can be connected without considering the direction of the connecting cable 60. Other apparatuses to be connected by means of the connecting cable 60 may be, for example, other harvesting apparatuses configured similarly to the energy harvesting apparatus 1. Other apparatuses may be a predetermined load serving as a supply destination of electric power from the energy harvesting apparatus 1.

[Cover Member 50]

Figure 5:
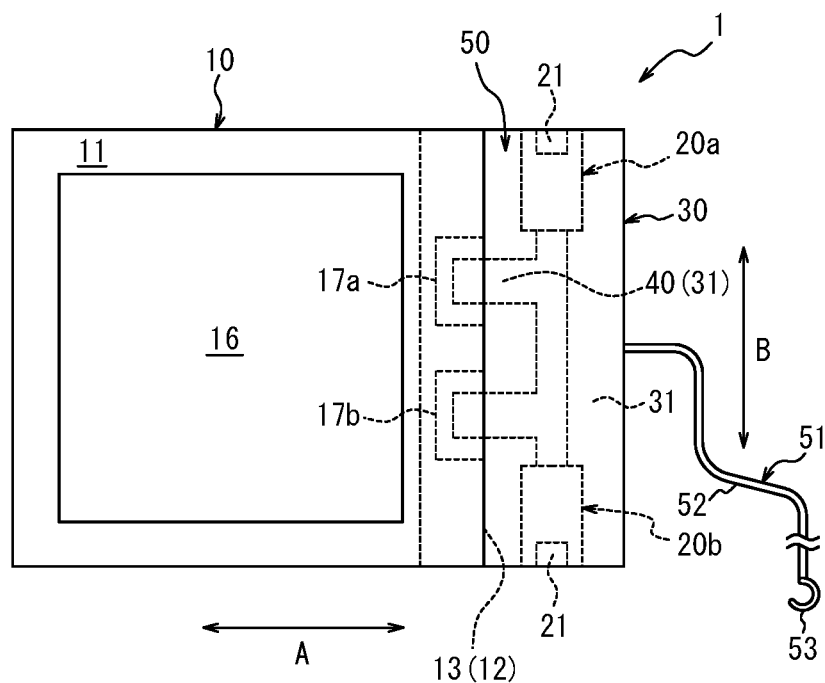
FIG. 5 is a plan view of the energy harvesting apparatus shown in FIG. 1 when having a cover member.
Figure 6:
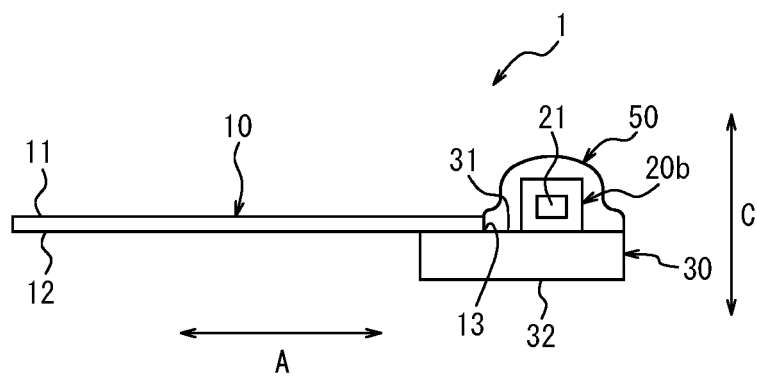
FIG. 6 is a front view of the energy harvesting apparatus shown in FIG. 1 when having a cover member.

The energy harvesting apparatus 1 may further include a cover member. FIG. 5 is a plan view when the energy harvesting apparatus 1 includes a cover member 50. FIG. 6 is a front view when the energy harvesting apparatus 1 includes the cover member 50. The cover member 50 covers at least a part of the first connector 20a and the second connector 20b. The cover member 50 may cover the first connector 20a and the second connector 20b and a part of the front surface 31 of the rigid member 30 located around the first connector 20a and the second connector 20b, or may cover the entire front surface 31 of the rigid member 30 including the first connector 20a and the second connector 20b as shown in FIGS. 5 and 6. The cover member 50 may have a high rigidity or may be soft. Materials of the cover member 50 include resins, elastomers, metals, and cloths. By providing the cover member 50, the energy harvesting apparatus 1 can improve the environmental resistance of the first connector 20a, the second connector 20b and the like.

[Fixing Member 51]

As shown in FIG. 5, the energy harvesting apparatus 1 may further include a fixing member 51. The fixing member 51 can be used to fix the position of the energy harvesting apparatus 1 by fixing it a fixed object such as a surrounding tree or a window frame when the energy harvesting apparatus 1 is operated for power generation. As shown in FIG. 5, the fixing member 51 may include, for example, a cord-shaped elongated part 52 having flexibility, and a hook-shaped fastening part 53 attached to the distal end of the elongated part 52. In the case where the fixing member 51 includes the elongated part 52 and the fastening part 53, the elongated part 52 is wound around a surrounding fixed object and fixed to the fixed object by the fastening part 53, whereby the position of the energy harvesting apparatus 1 can be fixed. The fixing member 51 is attached to, for example, the cover member 50 or the rigid member 30. In the present embodiment, the fixing member 51 is attached to the cover member 50. In the case where the fixing member 51 includes the elongated part 52, when the energy harvesting apparatus 1 is not used for power generation, the elongated part 52 can be wound around the cover member 50 and stored, for example.

[Configuration of Partially Transparent Energy Harvesting Apparatus 1]

The energy harvesting apparatus 1 may be partially composed of a transparent member. In this instance, the electric wiring 40 is a flexible wiring board 41 which is at least partially transparent. The rigid member 30 is made of a transparent resin, glass, or the like, and is at least partially transparent. The flexible wiring board 41 and the rigid member 30 as the electric wiring 40 are bonded to each other with a transparent bonding material interposed therebetween. When the energy harvesting apparatus 1 partially formed of a transparent member comprises the cover member 50, the cover member 50 preferably covers only the first connector 20a, the second connector 20b, and a part of the front surface 31 of the rigid member 30 located around the first connector 20a, the second connector 20b, in order to expose a transparent part. When the cover member 50 is formed of a transparent material, as shown in FIGS. 5 and 6, the entire front surface 31 of the rigid member 30, including the first connector 20a and the second connector 20b, may be covered. By configuring a part of the energy harvesting apparatus 1 with a transparent member in this manner, an object located at a distance and overlapping the energy harvesting apparatus 1 as viewed from the user can be visually recognized by the light transmitted through the energy harvesting apparatus 1, so that the visibility can be improved. This is particularly useful when the energy harvesting apparatus 1 is used by being suspended on, for example, a window frame or other member. In addition, when the energy harvesting apparatus 1 is used while being suspended on a window frame or other member, this provides an effect of making the interior of the room brighter by allowing external light to pass through the energy harvesting apparatus 1. In addition, by configuring a part of the energy harvesting apparatus 1 with a transparent member, it is possible to improve the design.

It is preferable that the energy harvesting module 10 overlaps 40% or more of the rigid member 30 along the second direction B. With such a configuration, the energy harvesting module 10 can be firmly fixed to the rigid member 30 and also the rigidity of the energy harvesting module 10 can be increased. Since the energy harvesting module 10 of the present embodiment overlaps the rigid member 30 over the entire length along the second direction B, the energy harvesting module 10 is more firmly fixed to the rigid member 30 and the rigidity of the energy harvesting module 10 is further enhanced.

[First Variation]

Figure 7:
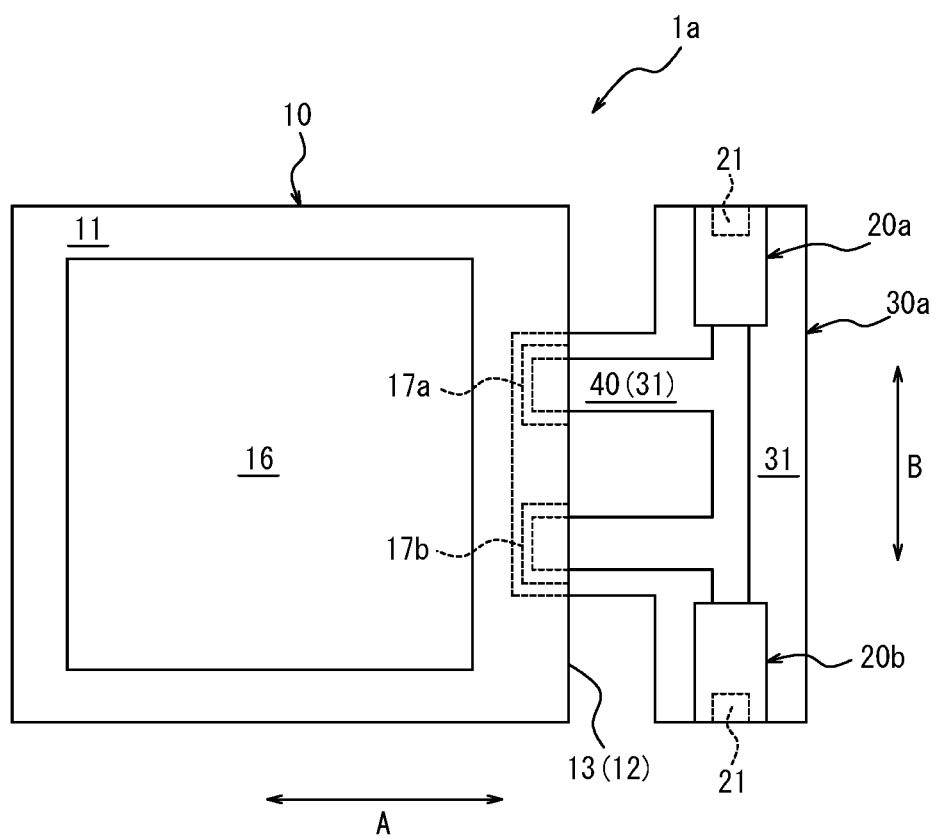
FIG. 7 is a plan view showing a first variation of the energy harvesting apparatus shown in FIG. 1.

FIG. 7 is a plan view showing an energy harvesting apparatus 1a as a first variation of the energy harvesting apparatus 1. As shown in FIG. 7, the energy harvesting apparatus 1a differs from the energy harvesting apparatus 1 in that a rigid member 30a is provided instead of the rigid member 30. In the plan view of FIG. 7, the length of the rigid member 30a along the second direction B of a part overlapping the energy harvesting module 10 is shorter than the length of a part overlapping the first connector 20a and the second connector 20b along the second direction B. The length of the rigid member 30a along the second direction B of the part overlapping the first connector 20a and the second connector 20b is the same as the length of the rigid member 30. It is preferable that the energy harvesting module 10 overlaps 40% or more of the rigid member 30a along the second direction B. In the energy harvesting apparatus 1a, by using the rigid member 30a instead of the rigid member 30 as described above, it is possible to shorten the length along the second directions B of the part overlapping the energy harvesting module 10, and hence it is possible to achieve size reduction and weight reduction. Further, it is possible to improve the design.

[Variation 2]

Figure 8:
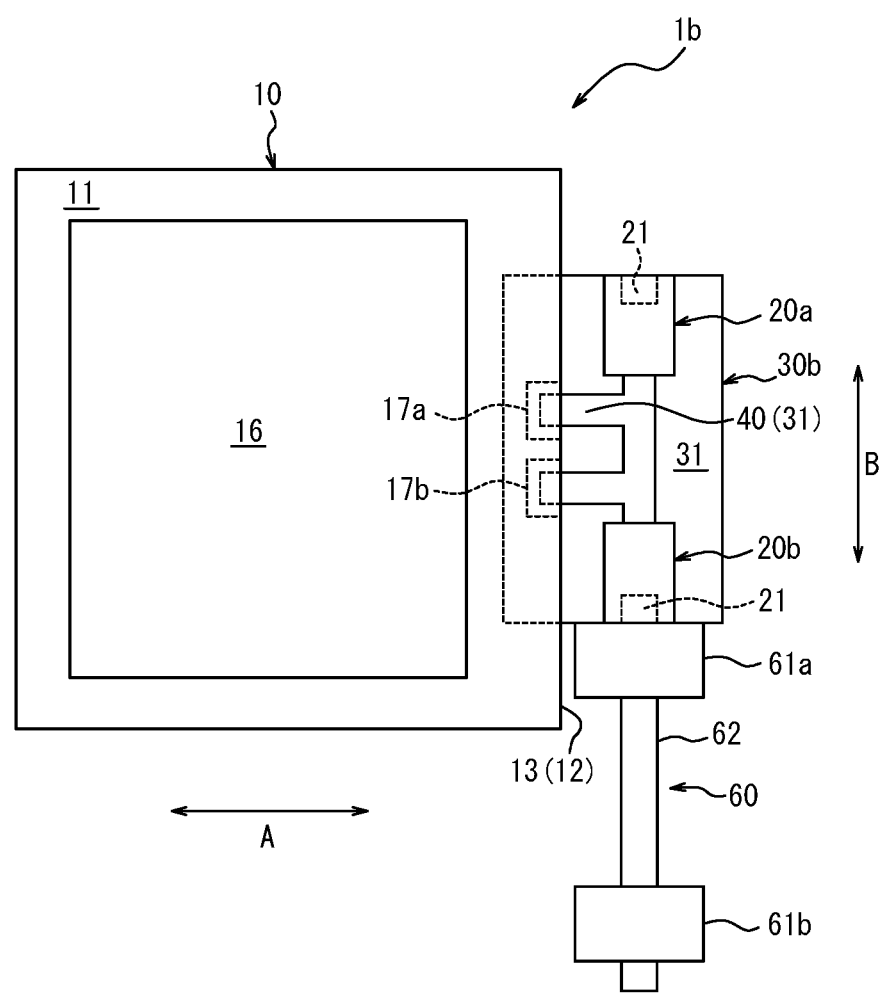
FIG. 8 is a plan view showing a second variation of the energy harvesting apparatus shown in FIG. 1.

FIG. 8 is a plan view showing an energy harvesting apparatus 1b as a second variation of the energy harvesting apparatus 1. As shown in FIG. 8, the energy harvesting apparatus 1b differs from the energy harvesting apparatus 1 in that a rigid member 30b is provided instead of the rigid member 30. In the second direction B, the opposite ends of the rigid member 30b are positioned inwardly of the energy harvesting module 10 from the opposite ends of the energy harvesting module 10. Therefore, the first connector 20a and the second connector 20b disposed on the rigid member 30b are located inwardly of the energy harvesting module 10 in the second direction B. More specifically, as shown in FIG. 8, in a state where the external connector 61 (first external connector 61a in FIG. 8) of the connecting cable 60 is connected to the first connector 20a or the second connector 20b (second connector 20b in FIG. 8), the external connector 61 is located at a position other than the outside of the energy harvesting module 10 in the second direction B. In other words, in the second direction B, the end on the conductive member 62 side of the external connector 61 is located at the same position as the end of the energy harvesting module 10 or inwardly of the energy harvesting module 10. It is preferable that the energy harvesting module 10 overlaps 40% or more of the rigid member 30b along the second direction B.

As described above, even when the external connector 61 is connected to the first connector 20a or the second connector 20b, the external connector 61 does not protrude in the second direction B beyond the energy harvesting module 10, so that the ease of handling of the energy harvesting module 1b can be improved. In particular, for example, when the energy harvesting apparatus 1b is connected to another energy harvesting apparatus configured in the same manner as the energy harvesting apparatus 1b using the connecting cable 60, even if the energy harvesting apparatus 1b and another energy harvesting apparatus are folded so as to overlap each other, the connecting cable 60 can be prevented from becoming an obstacle. Although the connecting cable 60 has been described as an external member of the energy harvesting apparatus 1b, the energy harvesting apparatus 1b may include the connecting cable 60 as a component. In addition, although both of the first connector 20a and the second connector 20b have been described as being located inwardly of the energy harvesting module 10 in the second direction B, at least one of the first connector 20a and the second connector 20b may be located inwardly of the energy harvesting module 10 in the second direction B.

[Third Variation]

Figure 9:
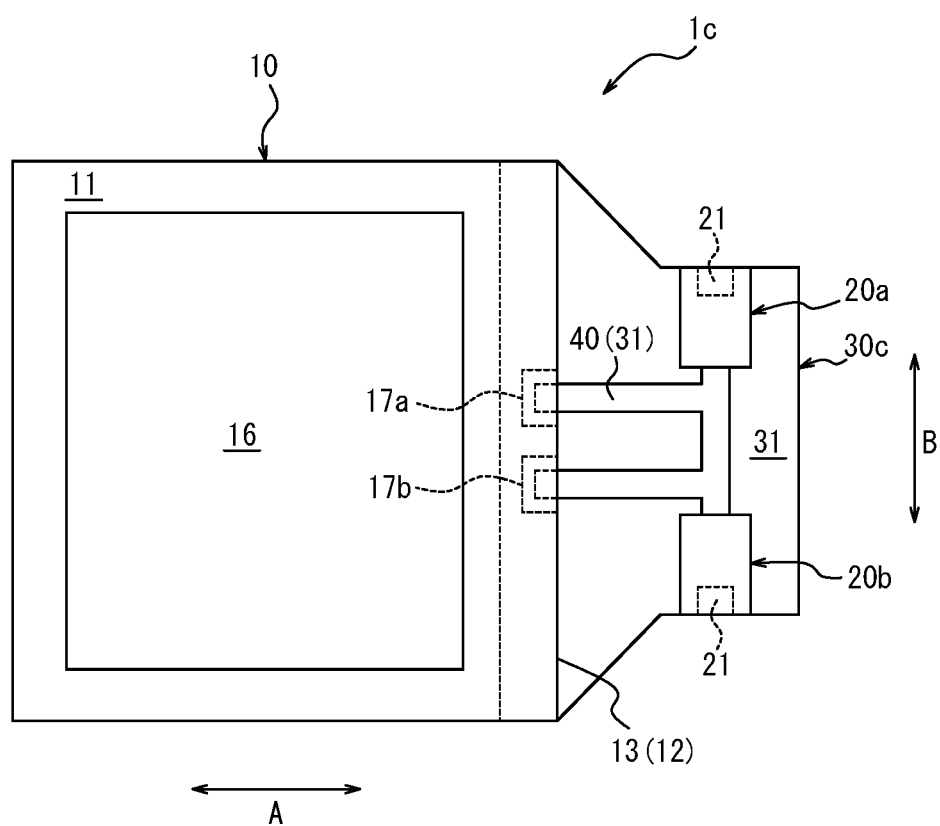
FIG. 9 is a plan view showing a third variation of the energy harvesting apparatus shown in FIG. 1.

FIG. 9 is a plan view showing an energy harvesting apparatus 1c as a third variation of the energy harvesting apparatus 1. As shown in FIG. 9, the energy harvesting apparatus 1c differs from the energy harvesting apparatus 1 in that a rigid member 30c is provided instead of the rigid member 30. The rigid member 30c is similar to the rigid member 30b except that the length along the second direction B increases toward the energy harvesting module 10 and covers the entire length of the energy harvesting module 10. The energy harvesting apparatus 1c may include the connecting cable 60 (see FIG. 8) as a component, as with the energy harvesting apparatus 1b. Thus, the energy harvesting apparatus 1c can improve the ease of handling similarly to the energy harvesting apparatus 1b and can increase the rigidity of the energy harvesting module 10 similarly to the energy harvesting apparatus 1a.

[Variation 4]

Figure 10:
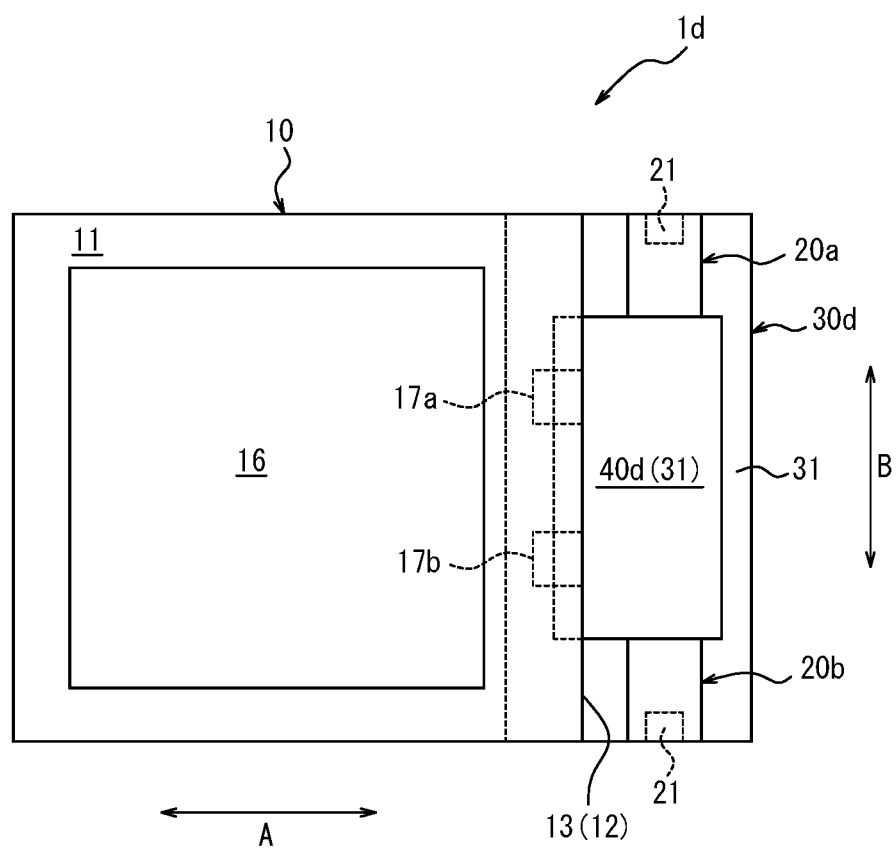
FIG. 10 is a plan view showing a fourth variation of the energy harvesting apparatus shown in FIG. 1.

FIG. 10 is a plan view showing an energy harvesting apparatus 1d as a fourth variation of the energy harvesting apparatus 1. As shown in FIG. 10, the energy harvesting apparatus 1d differs from the energy harvesting apparatus 1 in that a rigid member 30d is provided instead of the rigid member 30, and that an electric wiring 40d is provided instead of the electric wiring 40. The rigid member 30d is a rigid frame made of, for example, metal. The electric wiring 40d is a flexible wiring board and is disposed at a position where its periphery is covered by the rigid member 30d. The electrical wiring 40d constitutes, at a position where the periphery is covered by the rigid member 30d, a part of the front surface 31 of the rigid member 30d. The first extraction electrode 17a and the second extraction electrode 17b of the energy harvesting module 10 each contact the electric wiring 40d constituting a part of the front surface 31 of the rigid member 30d and are electrically connected to the electric wiring 40d. The first connector 20a and the second connector 20b contact the electrical wiring 40d and are electrically connected to the electrical wiring 40d. In this manner, the first connector 20a and the second connector 20b are each electrically connected to the energy harvesting module 10 via the electrical wiring 40d. Because the energy harvesting apparatus 1d includes the rigid member 30d, a rigid frame, and the electric wiring 40d, a flexible wiring board disposed at a position where the periphery is covered by the rigid member 30d, it is possible to achieve weigh reduction while ensuring strength. Further, by employing a transparent flexible wiring board as the electric wiring 40d, it is possible to achieve a design with highly transparency.

[Fifth Variation]

Figure 11:
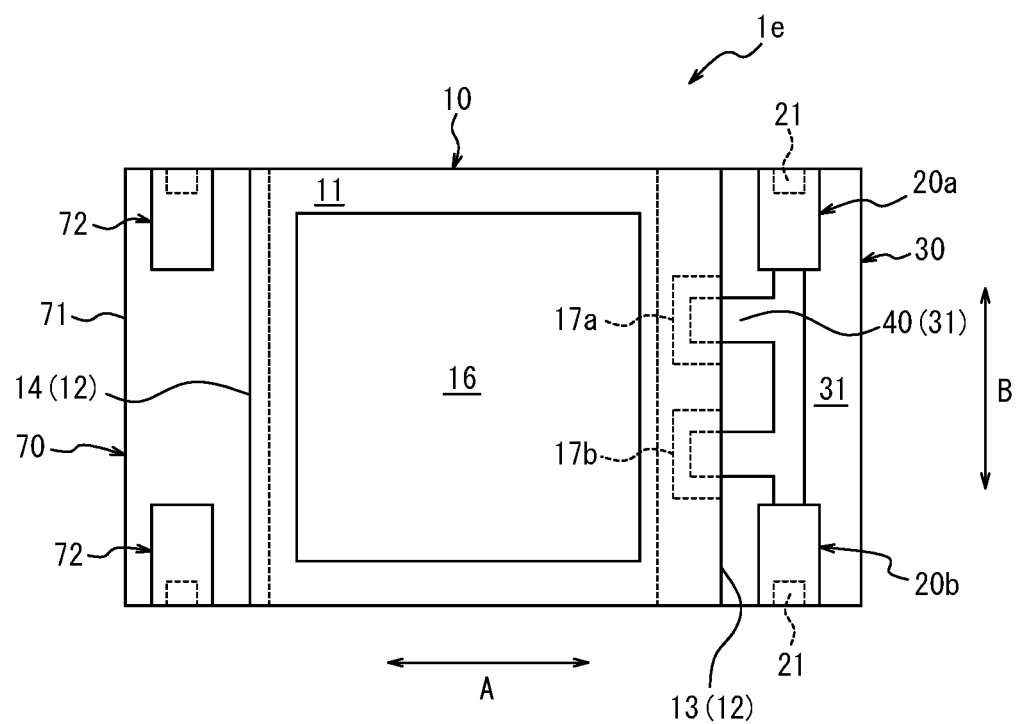
FIG. 11 is a plan view showing a fifth variation of the energy harvesting apparatus shown in FIG. 1.

FIG. 11 is a plan view showing an energy harvesting apparatus 1e as a fifth variation of the energy harvesting apparatus 1. The energy harvesting apparatus 1e differs from the energy harvesting apparatus 1 in that it further comprises a mechanical connector 70. The mechanical connector 70 is a connector mechanically connectable to the external connector 61 or to a mechanical connecting member which comprises a connector connectable to the mechanical connector 70 at opposite ends of, for example, a flexible strip-shaped member, from which an electrical connecting function has been removed from the external connector 61. Hereinafter, an example in which the external connector 61 is used as a connection target of the mechanical connector 70 will be described, but a mechanical connecting member can also be used in the same manner. The mechanical connector 70 is provided on the back surface 12 of the energy harvesting module 10 at an edge 14 which is opposite the edge 13. In particular, the mechanical connector 70 comprises a rigid part 71 provided so as to overlap the edge 14, and two mechanical connectors 72 disposed on the rigid part 71. The rigid part 71 is a member similar to the rigid member 30. The two mechanical connecting parts 72 have the same shape as the first connector 20a and the second connector 20b, respectively, but are only mechanically connectable to the external connector 61 and not electrically connectable to the external connector 61. The two mechanical connecting parts 72 are disposed at positions spaced apart from each other along the second direction B and are each connectable to the external connector 61 along the second direction B. Thus, since the energy harvesting apparatus 1e is connectable to other apparatuses by the mechanical connector 70 in addition to the connection by the first connector 20a and the second connector 20b, the connection with other apparatuses can be further stabilized.

[Sixth Variation]

Figure 12:
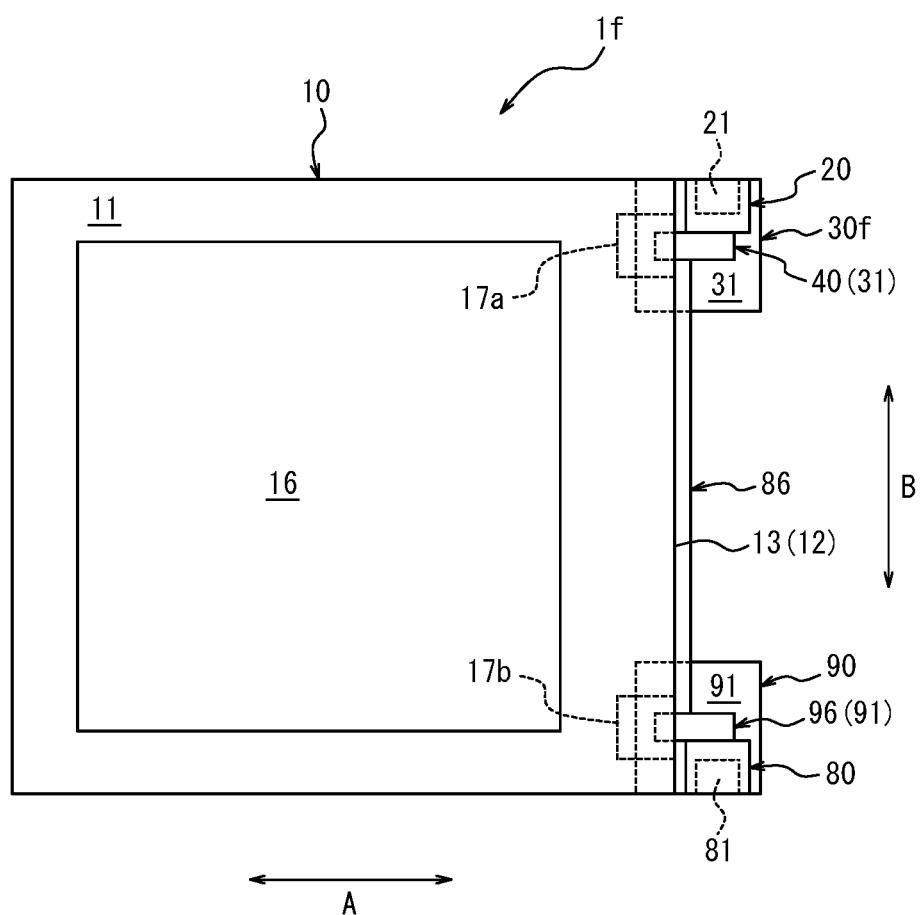
FIG. 12 is a plan view showing a sixth variation of the energy harvesting apparatus shown in FIG. 1.

FIG. 12 is a plan view showing an energy harvesting apparatus 1f as a sixth variation of the energy harvesting apparatus 1. The energy harvesting apparatus 1f differs from the energy harvesting apparatus 1 in that it includes a rigid member 30f instead of the rigid member 30, and that it further includes an additional connector 80, an additional rigid member 90, an additional electric wiring 96, and a conductive member 86. The energy harvesting apparatus 1f also includes the connector 20 as a single connector.

The rigid member 30f has a length that is less than half the length of the energy harvesting module 10 in the second direction B. The rigid member 30f is similar to the rigid member 30 in the other points.

The additional connector 80 is mechanically and electrically connectable to the external connector 61 and has the same configuration as the connector 20. The additional rigid member 90 is a flat plate member and has the same configuration as the rigid member 30f. The additional electric wiring 96 forms a part of the front surface 91 of the additional rigid member 90. The additional electrical wiring 96 is similar to the electrical wiring 40 in the other points.

In the energy harvesting module 10, a part of the edge 13 of the back surface 12 on one side (the upper side in FIG. 12) is disposed on the front surface 31 of the rigid member 30f, and a part of the edge 13 on the other side (the lower side in FIG. 12) is disposed on the front surface 91 of the additional rigid member 90. The additional connector 80 is disposed on the front surface 91 of the additional rigid member 90 at a position spaced apart from the energy harvesting module 10. The additional connector 80 is electrically connected to the energy harvesting module 10 via the additional electrical wiring 96. In the embodiment shown in FIG. 12, the rigid member 30f is disposed at one end (upper end in FIG. 12) of the energy harvesting module 10 along the second direction B. The additional rigid member 90 is disposed at the other end (the lower end in FIG. 12) of the energy harvesting module 10 along the second direction B.

The conductive member 86 electrically connects the connector 20 to the additional connector 80. The conductive member 86 is formed of, for example, a thin conductive cable. As shown in FIG. 12, the conductive member 86 is disposed along the edge 13 of the energy harvesting module 10, for example. Thus, in the energy harvesting apparatus 1f, since the rigid member 30f and the additional rigid member 90 are disposed at positions corresponding to the connector 20 and the additional connector 80, respectively, the total amount of rigid members to be used can be reduced, whereby size reduction and weight reduction can be achieved. Further, it is possible to improve the design.

The foregoing description merely illustrates one embodiment of the present disclosure and it goes without saying that various modifications may be made in the claims.

For example, in the energy harvesting apparatus 1, the connector 20 has been described as including the first connector 20a and the second connector 20b. However, one or three or more connectors 20 may be provided. It is preferable that two or more connectors 20 are provided including the first connector 20a and the second connector 20b because the energy harvesting apparatus 1 allows for bidirectional connection of other apparatuses.

INDUSTRIAL APPLICABILITY

According to the present disclosure, it is possible to provide an energy harvesting apparatus capable of reducing the stress applied to the energy harvesting module when the connector is detached from the external connector while ensuring portability.

REFERENCE SIGNS LIST 1, 1a-1f Energy harvesting apparatus
10 Energy harvesting module
11 Front surface of energy harvesting module
12 Back surface of energy harvesting module
13 Edge of back surface of energy harvesting module
14 Opposite edge
16 Solar panel
17 Extraction electrode
17a First extraction electrode
17b second extraction electrode
20 Connector
20a First connector
20b Second connector
21 Connecting part
30, 30a-30d, 30f Rigid member
31 Front surface of rigid member
32 Back surface of rigid member
40, 40d Electrical wiring
41 Flexible wiring board
50 Cover member
51 Fixing member
52 Elongated part
53 Fastening part
60 Connecting cable
61 External connector
61a First external connector
61b Second external connector
62 Conductive member
70 Mechanical connector
71 Rigid part
72 Mechanical connecting part
80 Additional connector
81 Connecting part
86 Conductive member
90 Additional rigid member
91 Surface of additional rigid member
96 Additional electrical wiring
A First direction
B Second direction
C Thickness direction
T1 Thickness of energy harvesting module
T2 Thickness of connector
T3 Thickness of rigid member

The invention claimed is:

1. An energy harvesting apparatus, comprising:
a flexible energy harvesting module having a flat plate shape;
a connector which is mechanically and electrically connectable to an external connector;
a rigid member having a flat plate shape; and
an electric wiring constituting a part of a front surface of the rigid member,
wherein an edge of a back surface of the energy harvesting module is disposed on the front surface of the rigid member,
the connector is disposed on the front surface of the rigid member at a position spaced apart from the energy harvesting module and is electrically connected to the energy harvesting module via the electric wiring,
the electric wiring is a flexible wiring board,
at least a part of the flexible wiring board is transparent,
at least a part of the rigid member is transparent, and
the flexible wiring board and the rigid member are bonded to each other with a transparent bonding material interposed therebetween.

2. The energy harvesting apparatus of claim 1, wherein the connector includes a first connector and a second connector, and
in a plan view of the energy harvesting module, the first connector and the second connector are disposed at positions spaced apart from each other along a second direction perpendicular to a first direction in which the energy harvesting module is positioned with respect to the rigid member, the first connector and the second connector being connectable to the external connector along the second direction.

3. The energy harvesting apparatus of claim 2, wherein the energy harvesting module overlaps 40% or more of the rigid member along the second direction.

4. The energy harvesting apparatus of claim 2, wherein at least one of the first connector and the second connector is positioned inwardly of the energy harvesting module in the second direction.

5. The energy harvesting apparatus of claim 4, further comprising a connecting cable including the external connector which is detachably attachable to at least one of the first connector and the second connector, and
the external connector is located at a position other than the outside of the energy harvesting module in the second direction in a state where the external connector is connected to the first connector or the second connector.

6. The energy harvesting apparatus of claim 2, wherein the energy harvesting module has a first extraction electrode and a second extraction electrode which are positioned at the edge of the back surface of the energy harvesting module,
the first connector is electrically connectable to the first extraction electrode and the second extraction electrode through the electric wiring, and
the second connector is electrically connectable to the first extraction electrode and the second extraction electrode through the electric wiring.

7. The energy harvesting apparatus of claim 6, wherein the rigid member is a rigid substrate having the electric wiring integrally formed on the front surface.

8. The energy harvesting apparatus of claim 6, wherein the electric wiring forms a part of the front surface by covering a part of the rigid member.

9. The energy harvesting apparatus of claim 6, wherein the rigid member is a rigid frame, and
the electric wiring is a flexible wiring board and disposed at a position where a periphery is covered by the rigid member.

10. The energy harvesting apparatus of claim 1, further comprising:
an additional connector which is mechanically and electrically connectable to another external connector;
an additional rigid member having a flat plate shape;
an additional electric wiring constituting a part of a front surface of the additional rigid member; and
a conductive member for electrically connecting the connector and the additional connector, wherein
the additional connector is disposed on the front surface of the additional rigid member at a position spaced apart from the energy harvesting module and is electrically connected to the energy harvesting module via the additional electric wiring.

11. The energy harvesting apparatus of claim 1, further comprising a mechanical connector mechanically connectable to an external connector, the mechanical connector being provided at an edge, opposite to the edge, of the back surface of the energy harvesting apparatus.

12. The energy harvesting apparatus of claim 1, wherein the connector has a thickness which is larger than a thickness of the energy harvesting module.

13. The energy harvesting apparatus of claim 1, wherein the connector is a female connector.

14. The energy harvesting apparatus of claim 1, further comprising a cover member which covers at least a part of the connector on the front surface side of the rigid member.

* * * * *